(12) United States Patent  (10) Patent No.: US 8,759,919 B2
Wang  (45) Date of Patent: Jun. 24, 2014

(54) END-TO-END GAP FILL USING DIELECTRIC FILM

(71) Applicant: Taiwan Semiconductor Manufacturing Company, Ltd., Hsin-Chu (TW)

(72) Inventor: Shiang-Bau Wang, Pingzchen (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/800,663

(22) Filed: Mar. 13, 2013

(65) Prior Publication Data

US 2013/0193519 A1    Aug. 1, 2013

Related U.S. Application Data

(62) Division of application No. 13/025,414, filed on Feb. 11, 2011, now Pat. No. 8,404,534.

(51) Int. Cl.
*H01L 29/78* (2006.01)

(52) U.S. Cl.
USPC ........... 257/365; 257/368; 257/371; 257/372; 257/411; 257/E29.264

(58) Field of Classification Search
USPC ........... 257/411, 365, 368, 371, 372, E29.264
See application file for complete search history.

(56) References Cited

U.S. PATENT DOCUMENTS

| 2002/0102782 A1* | 8/2002 | Oshima | 438/200 |
| 2007/0235823 A1* | 10/2007 | Hsu et al. | 257/411 |
| 2007/0284671 A1* | 12/2007 | Tsutsumi et al. | 257/369 |

OTHER PUBLICATIONS

USPTO, Office Action, U.S. Appl. No. 13/025,414, Oct. 17, 2011, 5 pgs.
USPTO, Office Action, U.S. Appl. No. 13/025,414, Feb. 1, 2012, 9 pgs.
USPTO, Office Action, U.S. Appl. No. 13/025,414, Jun. 12, 2012, 11 pgs.

* cited by examiner

*Primary Examiner* — Minchul Yang
(74) *Attorney, Agent, or Firm* — Haynes and Boone, LLP

(57) ABSTRACT

A method for fabricating a semiconductor device includes forming a plurality of gate structures on a semiconductor substrate. The plurality of gate structures are arranged in a plurality of lines, wherein an end-to-end spacing between the lines is smaller than a line-to-line spacing between the lines. The method further includes forming an etch stop layer over the gate structures, forming an interlayer dielectric over the gate structures, and forming a dielectric film over the gate structures before the interlayer dielectric is formed. The dielectric film merges in end-to-end gaps formed in the end-to-end spacing between the gate structures.

20 Claims, 6 Drawing Sheets

END-TO-END GAP FILL USING DIELECTRIC FILM

PRIORITY DATA

This application is a divisional of U.S. Ser. No. 13/025,414, filed Feb. 11, 2011, and entitled "End-to-End Gap Fill Using Dielectric Film," the entire disclosures of which is incorporated herein by reference.

BACKGROUND

The present disclosure relates generally to semiconductor manufacturing. Specifically, the present disclosure relates to devices with line-end to line-end spaces and a dielectric film within those spaces.

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

Some semiconductor devices include a multitude of gates laid out in parallel lines on the substrate. The gates are much longer than they are wide, and there are typically multiple gates in a single line arranged end-to-end. The space between parallel lines is referred to herein as "line-to-line spacing," and the spacing between gates in the same line is referred to herein as "end-to-end spacing." The gates are formed with sidewall spacers surrounding dummy gates. The film used to make the sidewall spacers does not completely fill either the line-to-line gaps or the end-to-end gaps. A Contact Etch Stop Layer (CESL) is then formed over the gates, and an interlayer dielectric (ILD) is formed over the CESL. The ILD is used to fill the gaps between the parallel lines and also to fill the end-to-end gaps.

Portions of the ILD, CSEL, and sidewall spacer film are then removed, exposing the dummy gates. However, these processes can leave an air gap in some end-to-end spaces as the ILD is removed. Subsequent deposition of gate metal can leave metal in the end-to-end gaps, interfering with subsequent overlay box alignment and causing shorts at contacts. Therefore, what is needed is an improved semiconductor device and method for making the same.

SUMMARY

The present disclosure provides for many different embodiments. In one embodiment, a method for fabricating a semiconductor device includes forming a plurality of gate structures on a semiconductor substrate. The plurality of gate structures are arranged in a plurality of lines, wherein an end-to-end spacing between the lines is smaller than a line-to-line spacing between the lines. The method further includes forming an etch stop layer over the gate structures, forming an interlayer dielectric over the gate structures, and forming a dielectric film over the gate structures before the interlayer dielectric is formed. The dielectric film merges in end-to-end gaps formed in the end-to-end spacing between the gate structures.

In another embodiment, a semiconductor device includes a semiconductor substrate and a plurality of gates formed on the semiconductor substrate. The plurality of gates includes lines with a line-to-line spacing between parallel ones of the lines and an end-to-end spacing between co-linear ones of the gates. The semiconductor device further includes an interlayer dielectric formed over the gates and a dielectric film formed between the gates and the interlayer dielectric. The dielectric film merges within end-to-end gaps of the gates.

In another embodiment, a method for manufacturing a semiconductor device includes forming a plurality of gates on a substrate. The gates include sidewalls and dummy gate structures, wherein the gates are formed in a plurality of parallel lines on the substrate with a spacing between parallel lines being less than an end-to-end spacing between co-linear gates. The method also includes forming an interlayer dielectric over the plurality of gates and forming a dielectric film between the plurality of gates and the interlayer dielectric, the dielectric film merging within the end-to-end spacing between co-linear gates and not merging between parallel lines. The method further includes removing portions of the interlayer dielectric to expose the dummy gate structures.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to semiconductor manufacturing. Specifically, the present disclosure relates to devices that use a dielectric film other than an ILD to fill end-to-end gaps.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer includes embodiments where the first and second layer are in direct contact and those where one or more layers are interposing the first and second layer.

Figure 1:
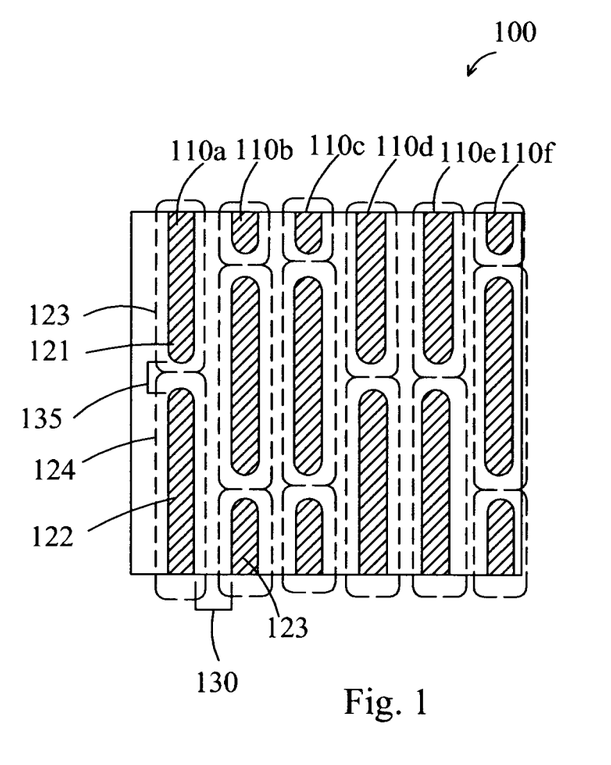
FIG. 1 is top-down image of a portion of an exemplary semiconductor device according to one embodiment.

FIG. 1 is top-down image of a portion of an exemplary semiconductor device 100 according to one embodiment. FIG. 1 shows gates (e.g., gates 121, 122) arranged in lines 110. In this example, gates 121 and 122 are in the same line 110a, gate 123 is in line 110b, and other lines 110 similarly have multiple gates. A line-to-line space 130 is shown as an example between lines 110a and 110b. An example end-to-end spacing 135 is shown between the two co-linear gates 121, 122.

Of note in FIG. 1 is the film layer exemplified by areas 123, 124 and shown as other areas bounded by dashed lines. In some embodiments, the film layer is deposited as a single layer over the whole surface of device 100 during manufacture. In other embodiments, the film layer is deposited in discrete areas using step coverage, as shown in FIG. 1. In any event, the film fills end-to-end gaps but does not completely fill line-to-line gaps, as explained further below.

Figure 2:
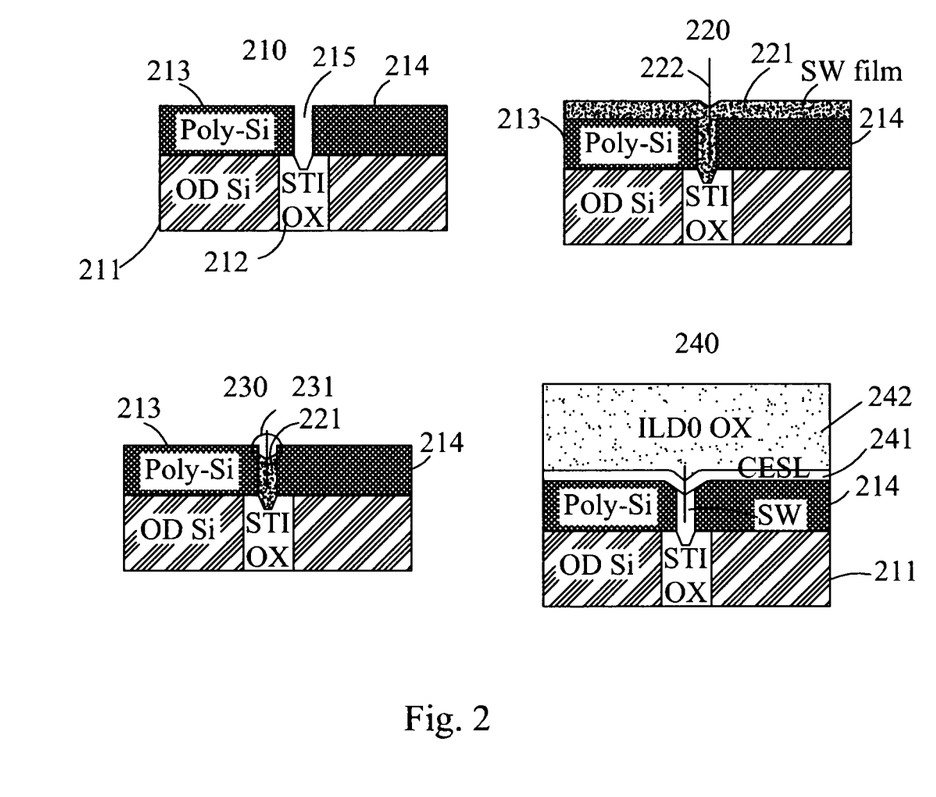
FIG. 2 is a cross-section illustration of the semiconductor device of FIG. 1 in various stages of manufacture from an end-to-end perspective.

FIG. 2 is a cross-section illustration of semiconductor device 100 in various stages of manufacture. Specifically, FIG. 2 shows a cross-section illustrating an end-to-end space between gates 121, 122 of FIG. 1.

View 210 shows silicon substrate 211 that has a Shallow Trench Isolation (STI) structure 212. On top of substrate 211, a polysilicon layer forms dummy gate structures 213 and 214. Gap 215 is an end-to-end gap between dummy gate structures 213, 214.

View 211 shows the same cross-section with dielectric film layer 221 deposited over dummy gates 213, 214. Dielectric film layer 221 fills gap 215 without leaving an air gap. Specifically, the thickness of layer 221 is such that the portions of film 221 on the vertical surfaces defining gap 215 have merged, thereby completely filling gap 215. Centerline 222 is an aid for illustrating that film 221 eliminates air gap 215 by merging within the end-to-end spacing. Further in this example, film 221 is shown as a sidewall spacer film, though the scope of embodiments is not so limited. As explained further below, film 221 can be made of a variety of materials and in a variety of process steps.

In view 230, some of film 221 has been removed by, e.g., an etching or polishing process. The film removal process leaves a small gap 231, but gap 231 has an aspect ratio small enough that it can be filled by subsequent layers without those subsequent layers merging within gap 231.

In view 240, further processing includes the deposition of CESL 241 and ILD 242. It is noted that neither CESL 241 nor ILD 242 contributes substantially to filling gap 215 and also that neither CESL 241 nor ILD 242 merge when deposited in gap 231. View 240 does not represent the end of the process for the semiconductor device. Instead, further processing in some embodiments includes removal of at least part of CESL 241 and ILD 242 to expose dummy gates 213, 214. In a further example, the dummy gates are replaced by the actual gate structures using, for example, metal deposition. However, since gap 215 was filled with merged film 221, gap 215 does not accumulate deposited metal.

Figure 3:
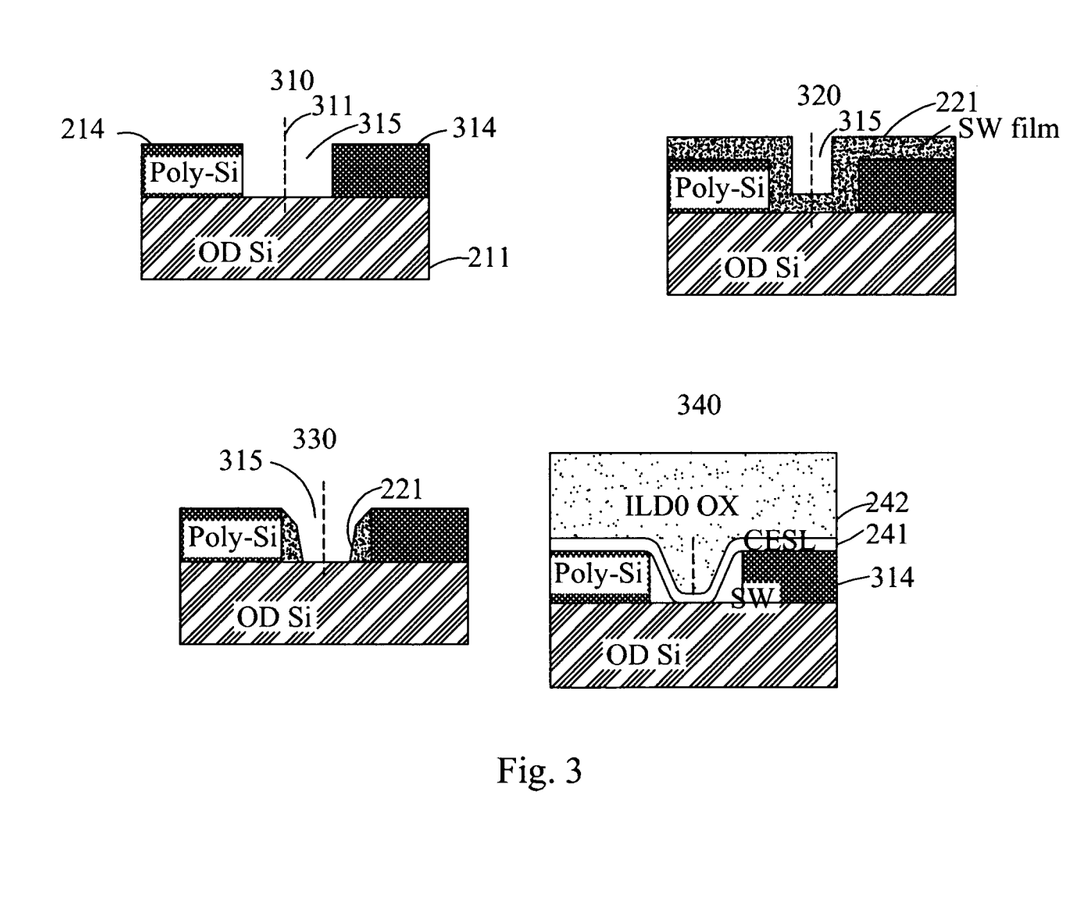
FIG. 3 is a cross-section illustration of the semiconductor device of FIG. 1 in various stages of manufacture form a line-to-line perspective.

FIG. 3 is a cross-section illustration of semiconductor device 100 in various stages of manufacture. Specifically, FIG. 3 shows a cross-section illustrating a line-to-line space between gates 121, 123 of FIG. 1. FIG. 3 shows the same manufacturing steps and the same layers as are shown in FIG. 2 but from a different vantage point. In the present example, end-to-end space 135 is about 30 nm, and line-to-line space 130 is about 40 nm, though the scope of embodiments includes applications with spaces of any size.

View 310 shows line-to-line gap 315 between dummy spacers 214, 314. Center line 311 illustrates the center of gap 315. In view 310, the dummy gates 214, 314 have been formed, but sidewall spacers are not formed yet.

In view 320, a deposition process forms layer 221. As shown in FIG. 3, layer 221 does not merge within gap 315 so that gap 315 retains an air gap at this step.

In view 330, some of layer 221 is removed, forming recognizable sidewall structures within gap 315. In view 340, further processing includes forming CESL 241 and ILD 242. In this embodiment, conventional sidewall spacers are maintained while providing for end-to-end gap filling.

The scope of embodiments is not limited to the specific layers and structure shown in FIGS. 2 and 3. Rather, the scope of embodiments includes other semiconductor devices that include different substrates and other layers. For instance, FIG. 4 is a cross-section illustration of a device wherein a polysilicon layer is built upon an oxide layer according to one embodiment.

In view 410, dummy gates 413, 414 are polysilicon structures formed upon oxide layer 411. Gap 415 is a line-to-line gap therebetween. Views 420, 430, 440 show sidewall structures built in gap 415.

View 420 shows dielectric layer 421 deposited over dummy gates 413, 414, but layer 421 does not merge within gap 415. In view 430, portions of layer 421 have been removed, forming sidewall structures 431. In view 440, CESL 441 and ILD 442 are formed on top of dummy gates 413, 414. As in the other examples, further processing may include removal of all or part of layers 441 and 442 to build the actual gate stacks.

Figure 4:
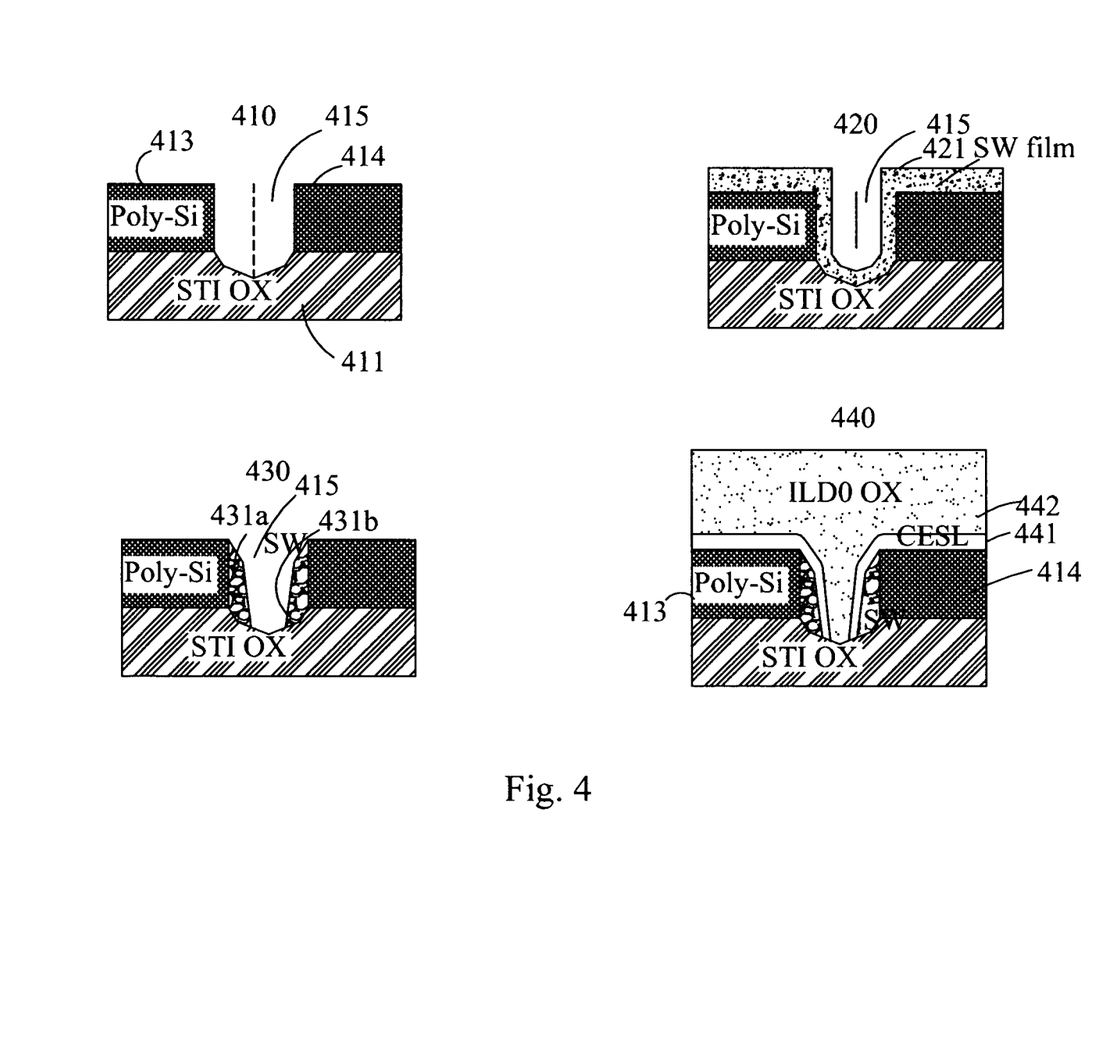
FIG. 4 is a cross-section illustration of a device wherein a polysilicon layer is built upon an oxide layer according to one embodiment.
Figure 5:
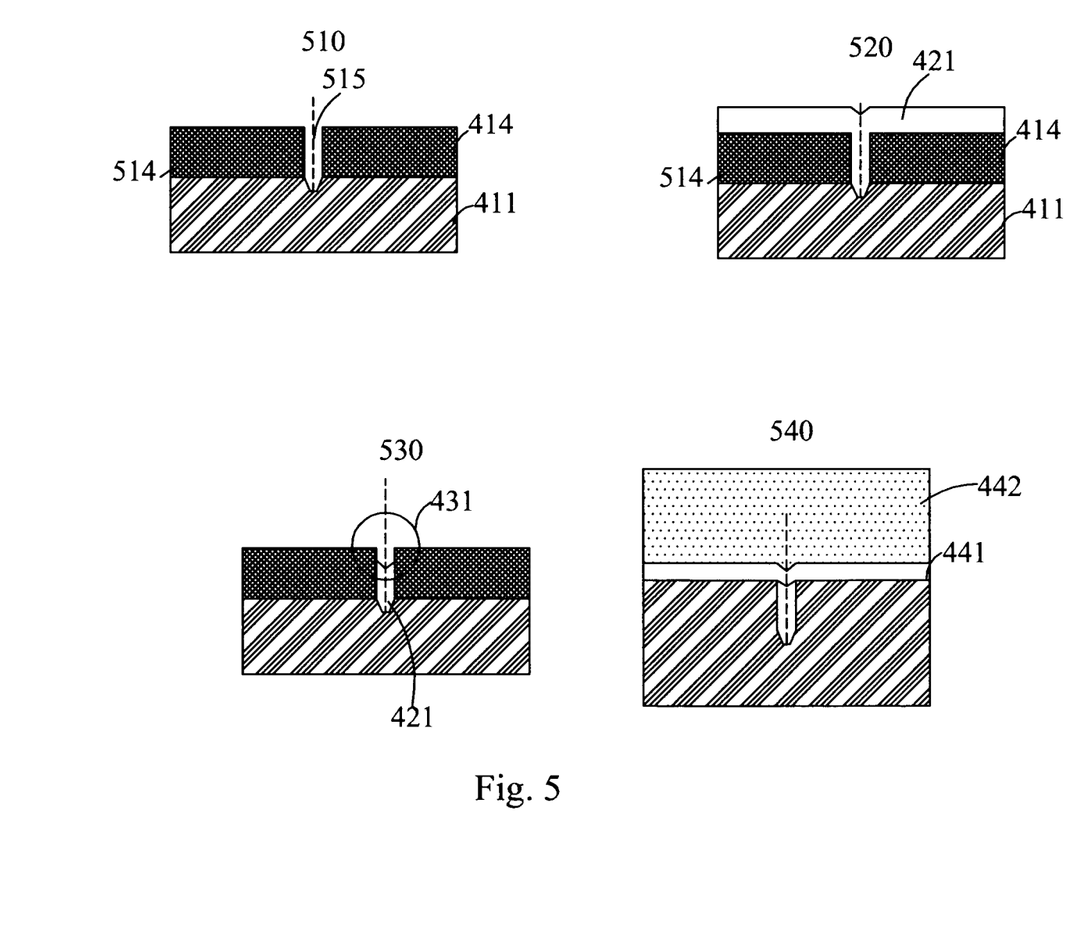
FIG. 5 is a cross-section illustration of the processes of FIG. 4 from an end-to-end perspective in contrast to the line-to-line perspective of FIG. 4.

FIG. 5 is a cross-section illustration of the processes of FIG. 4 but from an end-to-end perspective. Gap 515 is an end-to-end gap between dummy gates 514, 414 and is shown as an air gap in view 510.

View 520 shows dielectric layer 421 deposited upon the polysilicon layer. In this example, as in the example of FIG. 2, layer 421 merges within gap 515 so that the air gap is eliminated in this processing step. In view 530, layer 421 is partially removed, leaving only low-profile gap 431. In view 540, subsequent processing forms CESL 441 and ILD 442. Note that neither CESL 441 nor ILD 442 merge within low-profile gap 531, as gap 531 is shallow enough that a layer deposited over the top is sufficient to fill it.

Figure 6:
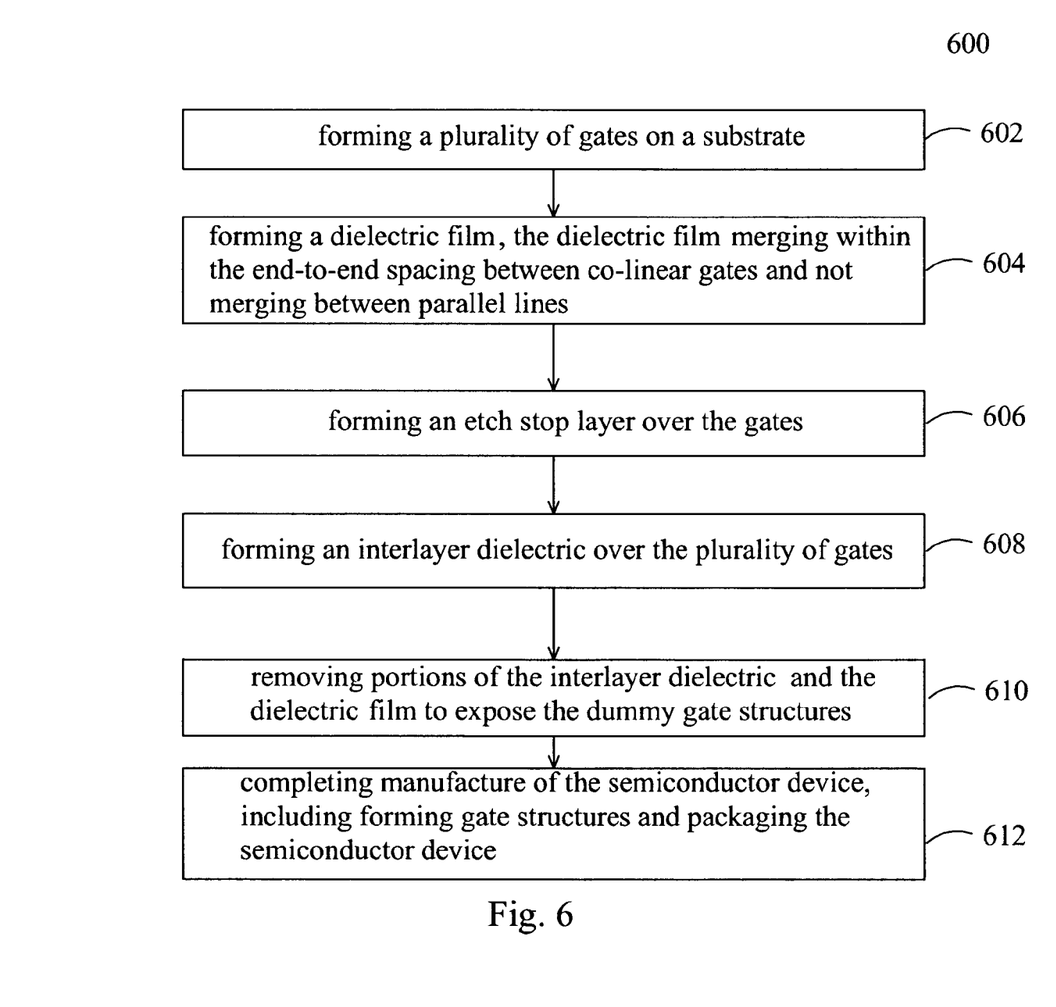
FIG. 6 provides a flow chart illustrating an embodiment of a method for manufacturing semiconductor devices according to one embodiment.

FIG. 6 provides a flow chart illustrating an embodiment of a method 600 for manufacturing semiconductor devices according to one embodiment. FIGS. 1-5 illustrate views of embodiments of semiconductor devices according to the method of FIG. 6. One of ordinary skill in the art recognizes additional steps that may be included in the method 600 and/or omitted from the method 600. For example, the structure of the semiconductor devices depicted in FIGS. 1-5 are exemplary only, and similar methods may be used to form any similar device. Furthermore, other structures such as metal interconnect layers may be included in the devices depicted in FIGS. 1-5.

The method 600 begins at block 602 where a plurality of gates are formed on a substrate. In this example, the gates have sidewalls and dummy gate structures, and the gates are arranged in parallel lines on the substrate. FIG. 1 shows an example arrangement where gates are arranged in parallel lines, and there are multiple gates in any given line. Thus, the arrangement of gates includes a line-to-line spacing and an end-to-end spacing. In this example, the relationship between the two different types of spacing is given by relation (1), where L2L_space is line-to-line spacing and E2E_space is end-to-end spacing:

$$L2L\_space > E2E\_space + 5 \text{ nm} \quad (1)$$

However, the scope of embodiments is not limited to this specific spacing relationship. The gates can be formed using any method now known or later developed, including conventional deposition and patterning techniques.

In block 604, a dielectric film is formed so that it fills end-to-end gaps. In one example, the dielectric film is the same film used to form the sidewall spacers in the gates, though the scope of embodiments is not limited to using sidewall spacer film. Examples of materials for use in forming the dielectric film include, but are not limited to, SiO2, SiN, SiCN, SiBN, SiOCN, SiON, SiOC, and SiC.

In the example of FIG. 6, the dielectric film completely fills the end-to-end gaps by merging substantially vertical portions of the layer within the end-to-end gaps, as illustrated in FIGS. 2 and 5. Thus, when the substantially vertical portions of the layers grow thick enough, the dielectric film can completely fill the end-to-end gaps, thereby eliminating air gaps in the end-to-end spaces.

In some examples, the thickness of the dielectric film is a factor in the ability of the film to merge within the end-to-end gaps. In this particular embodiment, the thickness of the film is chosen according to the following relation to ensure that the end-to-end gaps are completely filled:

$$L2L\_space/2 > \text{film thickness} > E2E\_space/2 \quad (2)$$

However, the scope of embodiments can include any film thickness sufficient to ensure that end-to-end gaps are filled. Moreover, in this example, the film thickness does not allow for merger of the film within line-to-line gaps.

Further in this embodiment, the dielectric film is deposited before CSEL deposition (in block 606) using a step coverage with precision sufficient to fill the end-to-end gaps. Examples of techniques for depositing the dielectric film include, but are not limited to, Atomic Layer Deposition (ALD) and Low Pressure CVD (LPCVD).

In some examples, block 604 further includes etching the dielectric film, as shown in view 230 of FIG. 2. The etching removes some, but not all, of the dielectric film so that the end-to-end gaps remain effectively filled with the dielectric film despite the etching process. To achieve such etching, some embodiments employ a dry etch and/or a certas etch to maintain a sufficient amount of dielectric film within the end-to-end gaps. In some scenarios, wet etching is avoided as it may etch away more dielectric film than is desired, especially within end-to-end gaps.

In block 606, an etch stop layer is formed over the gates. In one example a compressive CESL is used. Examples of etch stop layers include SiOC and SiC formed using Plasma Enhanced Chemical Vapor Deposition (PECVD), though the scope of embodiments is not limited to any particular material or deposition technique.

In block 608, an ILD is formed over the etch stop layer. One example of an interlayer dielectric includes a thick layer of a Si oxide, though the scope of embodiments can include any type of interlayer dielectric.

In block 610, portions of the interlayer dielectric and the dielectric film are removed to expose the dummy gate structures. In this example, the etching process of block 610 does not remove the dielectric film from the end-to-end gaps. Thus, the risk of metal contamination within the end-to-end gaps is reduced significantly or eliminated.

In block 612, manufacture of the semiconductor device is completed. Block 610 includes further processing, such as forming gate structures, as well as post-processing techniques, such as packaging the semiconductor device.

Method 600 is exemplary, and it is understood that other embodiments may include methods that add, omit, rearrange, or modify some actions. For instance, some embodiments may apply the dielectric film of block 604 in any of a variety of process stages. Examples of process stages that may be adapted according to embodiments to apply a dielectric film in end-to-end gaps include: offset sidewall stage, dummy sidewall stage, main sidewall stage, and pre-CESL sidewall stage.

Various embodiments may include advantages over other techniques. For instance, some conventional processes rely upon the ILD to fill the end-to-end gaps. However, the ILD sometimes cannot be relied upon as an effective gap filling material because subsequent etching steps may remove ILD material within the end-to-end spacing, where the removed material may be replaced by metal contamination during formation of gate structures. By contrast, various embodiments use a different dielectric film that merges within the end-to-end gaps and reliably fills the gaps. As a result, subsequent etching processes may be performed without removing an excessive amount of the dielectric film, and metal contamination of end-to-end spacing can be reduced or eliminated.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device comprising:
   a semiconductor substrate;
   a plurality of gates formed on the semiconductor substrate, the plurality of gates including lines with a line-to-line spacing between parallel ones of the lines and an end-to-end spacing between co-linear ones of the gates;
   an interlayer dielectric formed over the gates; and
   a dielectric film formed between the gates and the interlayer dielectric, the dielectric film completely filling end-to-end gaps of the gates.

2. The semiconductor device of claim 1 in which the dielectric film is not merged in line-to-line gaps of the gates.

3. The semiconductor device of claim 1 in which the gates include sidewall spacers and wherein the dielectric film is a same film as in the sidewall spacers.

4. The semiconductor device of claim 1 in which the dielectric film is formed at a thickness according to the following relationship:
   $L2L\_space/2 > \text{thickness} > E2E\_space/2$; where L2L_space is the line-to-line spacing, and where E2E_space is the end-to-end spacing.

5. The semiconductor device of claim 4 in which the plurality of gates are formed according to the following relationship:
   $L2L\_space > E2E\_space + C$; where L2L_space is the line-to-line spacing, and where E2E_space is the end-to-end spacing, further in which C is a distance in nanometers.

6. The semiconductor device of claim 1 in which the dielectric film is formed before the interlayer dielectric is formed.

7. The semiconductor device of claim 1 in which the end-to-end gaps do not include metal.

8. The semiconductor device of claim 1 in which the interlayer dielectric is formed over the dielectric film and does not merge in the end-to-end gaps.

9. The semiconductor device of claim 1 in which the dielectric film is selected from the list consisting of:
   SiO2, SiN, SiCN, SiBN, SiOCN, SiON, SiOC, and SiC.

10. A semiconductor device comprising:
    a plurality of gates formed upon a substrate, the gates formed in a plurality of lines, wherein gates in a line are separated by an end-to-end spacing, and wherein each of the lines are separated from adjacent lines by a line-to-line spacing; and
    sidewall structures formed for each of the gates, the sidewall structures including a dielectric film that completely fills in gaps in the end-to-end spacing and not merged in gaps in the line-to-line spacing.

11. The semiconductor device of claim 10 in which the dielectric film is formed at a thickness according to the following relationship:
    $L2L\_space/2 > thickness > E2E\_space/2$; where $L2L\_space$ is the line-to-line spacing, and where $E2E\_space$ is the end-to-end spacing.

12. The semiconductor device of claim 11 in which the plurality of gates are formed according to the following relationship:
    $L2L\_space > E2E\_space + C$; in which C is a distance in nanometers.

13. The semiconductor device of claim 10 further comprising:
    an interlayer dielectric layer formed over the dielectric film, wherein the interlayer dielectric layer does not merge in the gaps in the end-to-end spacing.

14. The semiconductor device of claim 10 in which the dielectric film is selected from the list consisting of:
    SiO2, SiN, SiCN, SiBN, SiOCN, SiON, SiOC, and SiC.

15. The semiconductor device of claim 10 in which the gaps in the end-to-end spacing do not include metal.

16. A semiconductor device comprising:
    a semiconductor substrate;
    a first line including a first plurality of gates arranged end-to-end upon the semiconductor substrate;
    a second line including a second plurality of gates arranged end-to-end upon the semiconductor substrate, wherein the first and second lines are arranged parallel to each other and have a line-to-line gap therebetween; and
    a plurality of sidewall structures formed in the line-to-line gap and in end-to-end gaps between ones of the gate structures, wherein the sidewall structures are formed of a film that completely fills the end-to-end gaps and not merged within the line-to-line gap.

17. The semiconductor device of claim 16 in which the film is formed at a thickness according to the following relationship:
    $L2L\_space/2 > thickness > E2E\_space/2$; where $L2L\_space$ is a spacing of the line-to-line gap, and where $E2E\_space$ is a spacing of the end-to-end gaps.

18. The semiconductor device of claim 17 in which gates are formed according to the following relationship:
    $L2L\_space > E2E\_space + C$; where C is a distance in nanometers.

19. The semiconductor device of claim 16 further comprising:
    an interlayer dielectric layer formed over the film, wherein the interlayer dielectric layer does not merge in the end-to-end gaps.

20. The semiconductor device of claim 16 in which the film is selected from the list consisting of:
    SiO2, SiN, SiCN, SiBN, SiOCN, SiON, SiOC, and SiC.

* * * * *